United States Patent

Fortmann et al.

[11] Patent Number: 6,064,511
[45] Date of Patent: May 16, 2000

[54] FABRICATION METHODS AND STRUCTURED MATERIALS FOR PHOTONIC DEVICES

[75] Inventors: Charles M. Fortmann, Chuorinkan, Japan; John H. Coleman, Locust Valley; Serge Luryi, Old Field, both of N.Y.; Ronald J. Tonucci, Waldorf, Md.

[73] Assignee: The Research Foundation of State University of New York, Stony Brook, N.Y.

[21] Appl. No.: 09/052,848

[22] Filed: Mar. 31, 1998

[51] Int. Cl.⁷ .................. G02F 1/017; G02B 1/12
[52] U.S. Cl. .............. 359/321; 359/580; 359/583; 359/586; 359/588; 427/532; 427/533; 427/535; 427/552; 427/553; 427/574
[58] Field of Search .................. 427/532, 533, 427/535, 551, 552, 553, 561, 563, 574; 359/577, 580, 583, 586, 589, 321

[56] References Cited

U.S. PATENT DOCUMENTS

| | | | |
|---|---|---|---|
| 4,686,162 | 8/1987 | Stangl et al. | 430/5 |
| 4,795,241 | 1/1989 | Komatsu et al. | 437/24 |
| 4,960,675 | 10/1990 | Tsuo et al. | 430/311 |
| 5,194,349 | 3/1993 | Tsuo et al. | 430/21 |
| 5,759,745 | 6/1998 | Hollingsworth | 430/313 |

*Primary Examiner*—Georgia Epps
*Assistant Examiner*—Margaret Burke
*Attorney, Agent, or Firm*—Baker Botts L.L.P.

[57] ABSTRACT

Structured materials for photonic devices, at wavelengths of X-ray, ultraviolet, visible, infrared and microwave radiation, can be made using layer growth techniques. Such a structure can be made layer by layer, by homogeneous deposition followed by localized modification for refractive index differentiation. Alternatively, the structure can be made by simultaneous growth of regions whose refractive index differs. The structures can be used as selective bandpass filters, and in photovoltaic solar cells, for example.

28 Claims, 3 Drawing Sheets

FABRICATION METHODS AND STRUCTURED MATERIALS FOR PHOTONIC DEVICES

TECHNICAL FIELD

This invention relates to photonic or electro-optic devices and, more specifically, to structured photonic device materials and their fabrication.

BACKGROUND OF THE INVENTION

For photonic devices, specifically for microwave photonic devices, structured materials have been fabricated by drilling regularly spaced holes into bulk materials; see, e.g., E. Yablonovitch et al., "Photonic Band Structures: the Face-centered Cubic Case", Physical Review Letters 58 (1989), p. 1950. Such structures interact preferentially with electromagnetic radiation having a wavelength which is on the order of the spacing between the holes.

In hole drilling, there are severe physical limitations as to structure thickness, hole diameter and spacing between the holes. Also, since drilled holes are necessarily straight, other crystal lattices, e.g. the diamond cubic lattice cannot be made in this fashion.

SUMMARY OF THE INVENTION

We have recognized that structured materials for photonic devices, at wavelengths of X-ray, ultraviolet, visible, infrared and microwave radiation, can be made using layer growth techniques. In a resulting structured material, the refractive index varies, preferably in a spatially periodic manner. Such structures can interact with electromagnetic radiation, e.g. by selective transmission or reflection, with selectivity being a function of wavelength and/or angle of propagation. The structures can be used as selective band-pass filters, and in photovoltaic solar cells, for example.

DETAILED DESCRIPTION

Figure 1:
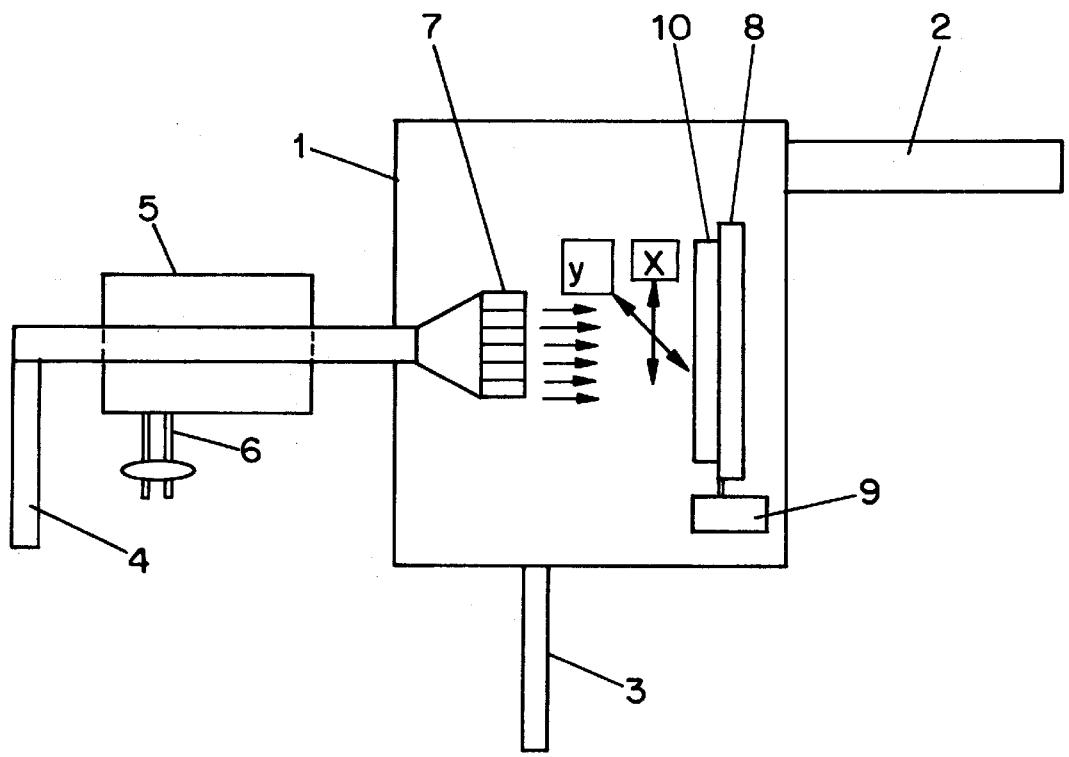
FIG. 1 is a schematic representation of an apparatus for making photonic structures using layer growth techniques.

FIG. 1 shows a vacuum deposition chamber 1 with a connection 2 to a vacuum pump (not shown), and a silane supply duct 3. A hydrogen supply duct 4 leads through a microwave cavity 5 with microwave generator 6, to a delivery nozzle 7. As hydrogen molecules pass through the microwave cavity 5, hydrogen radicals are formed. The delivery nozzle 7 has an outlet for producing a plurality of hydrogen radical beams, in a pattern as desired in the structure to be fabricated. For example, a honeycomb collimator, a plate into which holes have been drilled, a tube array or a grid can be used for beam delivery. A stage 8 which includes a heater and which is movable by an x-y translator 9 faces the delivery nozzle 7. The translator 9 may be purely mechanical or, for very fine control, may further include a piezo-electric activator. A substrate 10 is disposed on the stage 8, on which a desired photonic structure is to be grown.

The deposition apparatus shown in FIG. 1 is designed for a pressure of less than $10^{-5}$ torr when a sufficient hydrogen gas inflow is maintained through the microwave cavity, and no film-forming gases are present in the deposition chamber, which can be a quartz tube. The microwave electric field causes the hydrogen to dissociate, and ionized hydrogen atoms may be produced also. At a sufficient distance from the microwave cavity, the ionized species will be neutralized through collisions with the chamber walls. The neutral hydrogen radicals, and some background hydrogen molecules, are then transported to the deposition chamber in which the substrate is positioned. Prior to entering the deposition chamber, the hydrogen radicals are passed through a collimator to produce a shaped and patterned beam. When no gas other than hydrogen is present, most hydrogen radicals travel toward the substrate in a line-of-sight trajectory.

Figure 2:
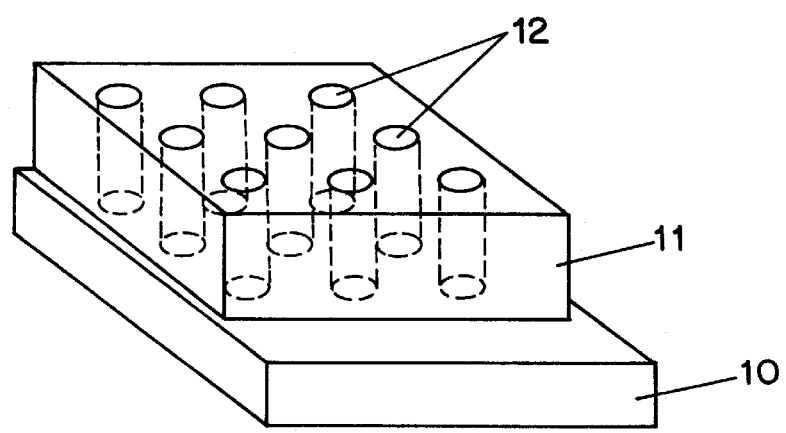
FIG. 2 is a phantom representation of a structure which can be made by the apparatus of FIG. 1.

FIG. 2 shows the substrate 10 on which a photonic structure has been grown including an amorphous silicon matrix 11 and hydrogen-rich or phase-changed silicon regions 12.

Figure 3:
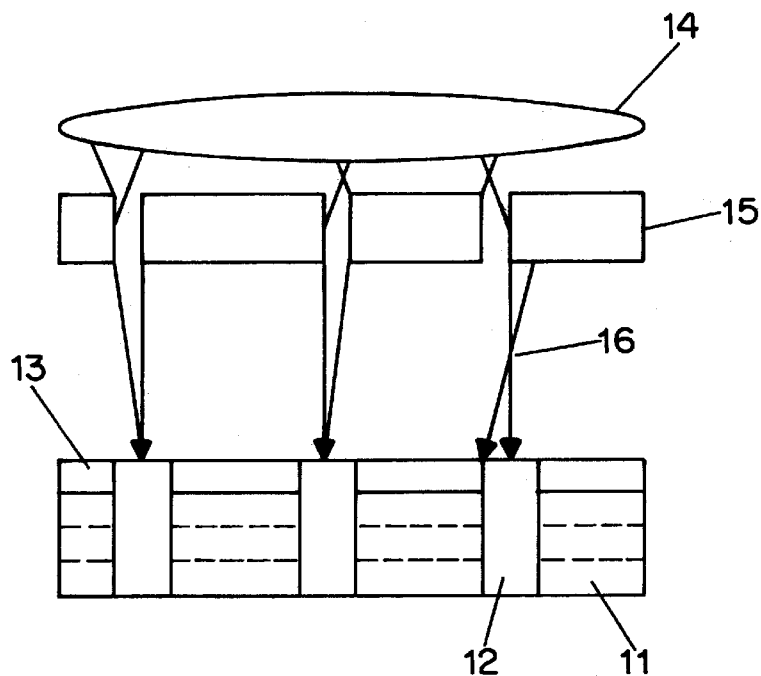
FIG. 3 is a schematic which illustrates hydrogenation of an amorphous silicon film in making the structure of FIG. 2.

FIG. 3 illustrates a photonic structure being grown layer by layer, including an amorphous silicon matrix 11 and hydrogen-rich or phase-changed silicon regions 12. On a previously formed and processed portion of the structure being grown, a top layer 13 of amorphous silicon has been deposited and is now being selectively hydrogenated by hydrogen radicals 14 passing through openings in a collimator 15 so as to form hydrogen radical beams 16 which locally hydrogenate the top layer 13.

Figure 4:
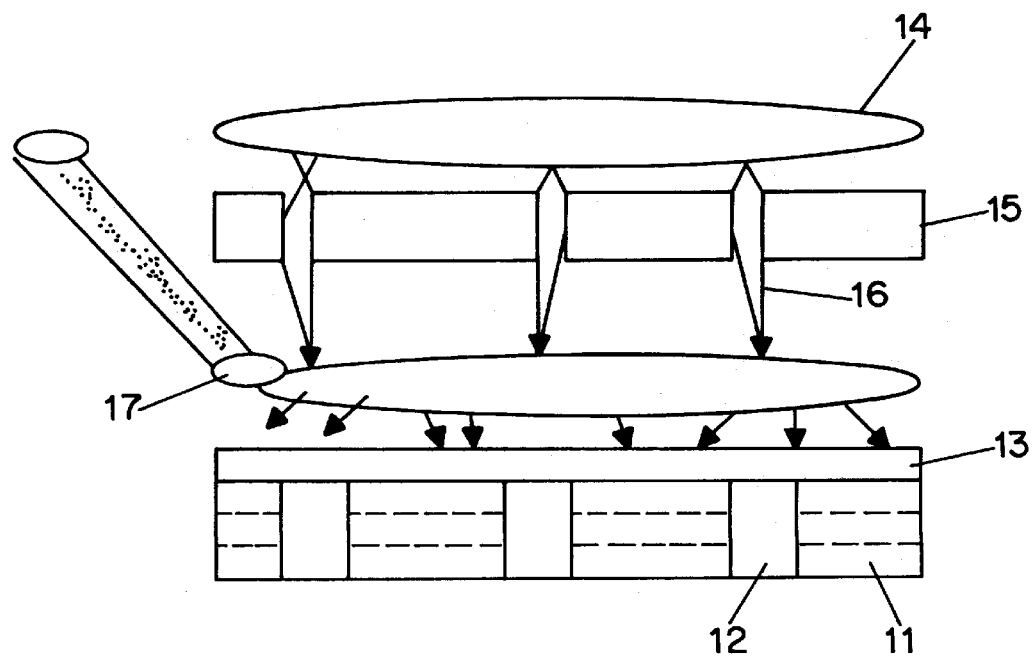
FIG. 4 is a schematic which illustrates deposition of a material structure having amorphous silicon and hydrogenated silicon regions.

For alternative processing, FIG. 4 illustrates a photonic structure being grown with hydrogenated silicon regions 12 growing along with the amorphous silicon matrix region 11. At the top 13 of the structure, amorphous silicon grows from silane radicals supplied through the gas inlet 17, and hydrogenated silicon grows where, additionally, hydrogen radicals are supplied through collimator 15 openings.

Figure 5:
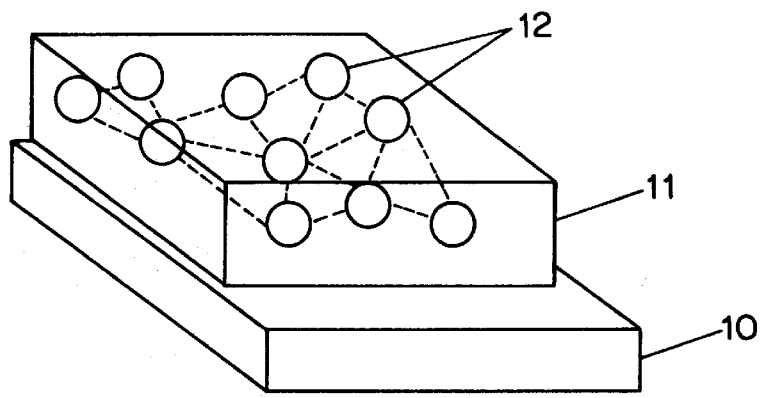
FIG. 5 is a phantom representation of a photonic structure having refractive index variations in three dimensions.

FIG. 5 shows the substrate 10 on which a structure has been grown including an amorphous silicon matrix 11 and hydrogen-rich or phase-changed regions 12 in the form of spheres arranged in three dimensions.

Figure 6:
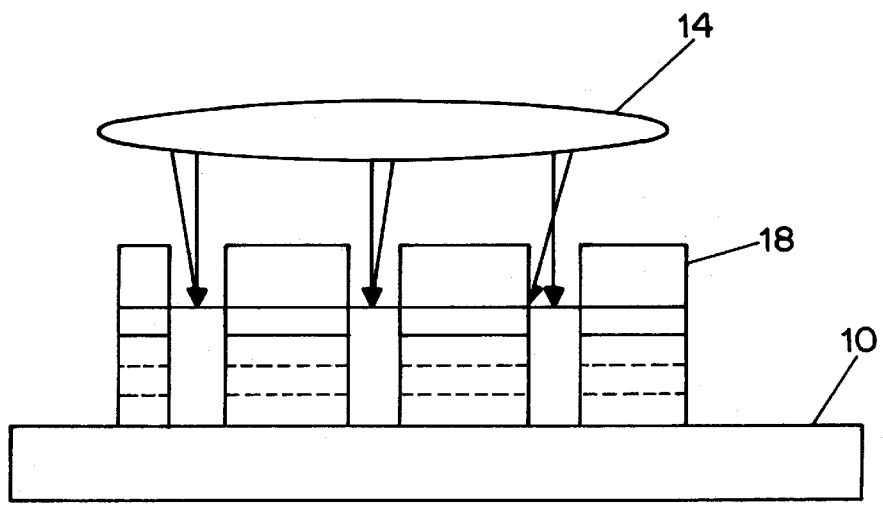
FIG. 6 is a schematic which illustrates use of a surface contact template in making a photonic structure.

FIG. 6 shows the substrate 10 on which a desired structure is being grown using a surface-contacting template or mask 18 with suitably disposed pores. Films which consist of amorphous silicon in their entirety are grown with the template removed, and the template is put in place when hydrogen radicals 14 are supplied for localized hydrogenation. As a template, an etched-through silicon wafer or glass plate can be used, for example. This procedure facilitates growth of a structure as illustrated by FIG. 5, for example.

For alignment on the growth surface, the template preferably extends past the surface, thus having an overhanging region. With an additional, stationary substrate placed under the overhang, with suitably placed conductive conduits in the additional substrate, and with suitably dimensioned pores in the overhang of the template, alignment of the beam vis-a-vis the growth surface can be ascertained by sensing current induced by an ion or electron flux through the pores in the overhang of the template.

The following specific examples are of amorphous silicon being locally hydrogenated or crystallized by hydrogen, resulting in regions with lowered refractive index within the amorphous silicon matrix. Other than with hydrogen, silicon may be alloyed with carbon, germanium, tin, nitrogen and oxygen, for example. Other materials which are suitable for localized refractive index alteration by exposure to hydrogen include amorphous silicon-germanium, amorphous silicon-carbon alloys, and a large number of carbon-based polymers which contain hydrogen and/or fluorine and/or chlorine. Refractive index changes may be due to changes in hydrogen concentration, changes in microstructure, formation of voids due material removal, and hydrogen-induced composition changes. For example, hydrogen ion and/or radical exposure causes selective removal of silicon from an amorphous silicon-germanium alloy. Similarly, such exposure results in carbon removal from an amorphous silicon-carbon alloy. Other than by hydrogen, corresponding changes can be induced by exposure to deuterium, fluorine, chlorine or oxygen, for example.

Suitable substrate materials include silicon, glass, stainless steel and plastic materials. Other than by vacuum deposition, layers can be deposited by glow-discharge chemical vapor deposition, hot-wire deposition, photo-assisted chemical vapor deposition or very-high frequency chemical vapor deposition, for example.

EXAMPLE 1

A photonic structure can be made by repeatedly and alternatingly depositing amorphous silicon and selectively hydrogenizing the deposited silicon. Each layer of amorphous silicon can be deposited 4 nm thick, for example, and the deposited layer is then selectively exposed to a hydrogen radical flux of suitable energy, e.g., in the range from 1 to 100 eV. Layer thickness and radical energy are chosen so as to ensure that exposed areas are uniformly hydrogenated. The selective exposure pattern may be a close-packed planar lattice of circular spots, with each spot being spaced from its six nearest neighbors by a distance which is the same as the spot diameter, e.g. 400 nm. Similarly, a square lattice can be made, in which each spot has four nearest neighbors.

For deposition, a flow of film-forming gas is present in the deposition chamber. The gas flow is maintained at a flow sufficient to ensure that the mean free path of vapor species is less than the distance between the collimator and the substrate. To this effect, the pressure in the deposition chamber is intentionally greater when the film forming gases are present. For example, for depositing amorphous silicon by hydrogen-induced dissociation of silane, a pressure in the range from 0.01 to 10 torr is suitable. Such pressures can be achieved by a high-speed vacuum pump, e.g. a turbomolecular pump. Collisions between hydrogen radicals and a film-forming gas, e.g. silane, result in the formation of meta-stable vapor species, e.g. $SiH_3$. These species deposit film on the surfaces that they strike, including the substrate. When a film of sufficient thickness (4 nanometers, for example, in the case of amorphous silicon) has been deposited, the film-forming gas is turned off, and the deposition chamber pressure is allowed to decrease. During this time the hydrogen radical flux may be maintained or turned off.

Selected regions of the deposited film are then hydrogenated by a hydrogen radical flux, now with the deposition chamber at a sufficiently low pressure to minimize gas phase collisions so that the hydrogen radical beam has a spot pattern related to the hydrogen radical energy, the aspect ratio of the collimator, the substrate-to-collimator distance and the background pressure in the deposition chamber.

As an alternative to hydrogen-induced dissociation of silane as described above for forming a film of amorphous silicon, such a film can be formed by plasma deposition. For example, with the substrate held on a metallic holder 8, and with a metallic nozzle 7, a suitable RF field can be generated with the nozzle 7 and the holder 8 serving as electrodes to which an AC voltage is applied. Silane from the supply duct 3 is ionized in a glow discharge in the RF field, forming a plasma out of which silicon is deposited on the substrate. For further details concerning this method see U.S. Pat. No. 5,470,784, issued Nov. 28, 1995 to John H. Coleman which is incorporated herein by reference.

In either mode of silicon deposition, the substrate is preferably held at a temperature in an approximate range from 150–400° C. Higher temperatures tend to foster an undesired polycrystalline structure, and at lower temperatures the semiconductor electrical properties tend to degrade.

EXAMPLE 2

Thin layers of amorphous silicon are deposited and selectively hydrogenated, cyclically as in Example 1 and using a close-packed planar exposure lattice, but with the exposure pattern shifted relative to the substrate between steps or groups of steps. Conveniently, shifting of the pattern results from translation of the substrate stage. The thickness of the deposited amorphous silicon layers, the spot size of the hydrogen beams, the number of cycles between lateral spot movements, the lateral spot displacement, and the distance between the spots determine the lattice parameter, a, of the photonic structure.

For a face-centered cubic structure, if the distance between a spot and each of its six nearest neighbors is 2R, the distance between crystallographic planes is $a=2\sqrt{2}R$.

The z-dimension, i.e., the direction of growth is determined by the energy of the hydrogen radical flux, the number of repeat deposition and hydrogenation cycles used to create a plane of hydrogenated spots and the thickness of the amorphous layer deposited per cycle. Larger dimensioned spots require several deposition-hydrogenation cycles. For the spherical hydrogenated spots for the face-centered cubic structure, the number of repeat cycles per plane of spots is $n=2R/d$, where R is the spot radius and d is the thickness of the amorphous silicon deposited in a single cycle. After a plane of lattice points has been formed, the collimator is moved an appropriate amount for forming the next plane of lattice points. Finer control of the shape of the lattice points or spots can be obtained by systematic variation of the hydrogen radical beam flux and/or systematic variation of the collimator spot size. The background pressure in the reactor can be used also to control the spot size, as collisions with the background gas pressure broaden the spot.

Structures can be prepared with connective "tissue" or "corridors" between regions of the same index, with repeated deposition and hydrogenation being carried out on a very fine scale. For fine-scale control, not more than about 4 nm of amorphous silicon is deposited prior to hydrogenation. The center of the new hydrogenated region is shifted by an amount equal to or less than the extent of the hydrogenated region lying just below, thereby ensuring a connection. For example, a connected face-centered cubic photonic crystal can be deposited by moving the hydrogen spots an amount less than R with each subsequent deposition.

Intentional defect structures can be made by altering a plane of spots to occur out of the proper sequence of the face-centered lattice sequence. This is effected readily by appropriately programmed substrate translation.

As a further alternative to the use of a hydrogen radical collimator or a surface-contacting template, a hydrogen beam writing technique can be used in which a beam of hydrogen radicals is directed to selected regions of the substrate to induce localized hydrogenation or amorphous-to-crystalline phase change. The scale at which hydrogenated or crystallized regions can be formed depends on the beam spot size. A beam can be electrically charged or neutral. A charged beam can be focused electrostatically and/or electromagnetically, and may be neutralized after focusing. Electrostatic and electromagnetic lenses for focusing a charged beam may have chromatic aberration related to the lens characteristics and the energy distribution of the beam. Space charge effects in the beam may cause broadening of the energy distribution and blurring. Still, with state-of-the art lenses, highly focused sub-micron spot-size beams may be generated, having a beam diameter of 100 nm at a current of 100 pA at 1 KeV, with an energy span of 10 eV.

EXEMPLARY USES OF THE STRUCTURES

Figure 7:
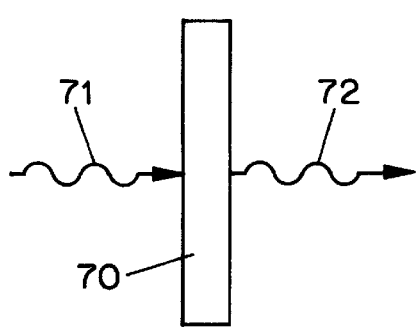
FIG. 7 is a schematic of a device including a photonic structure serving as a narrow-band-pass electromagnetic-radiation filter.
Figure 8:
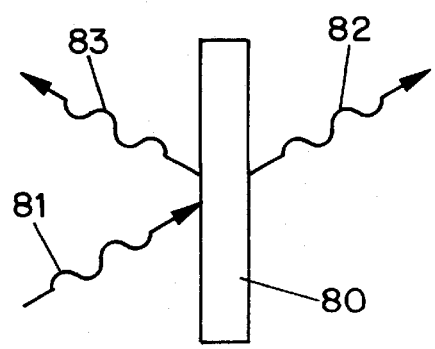
FIG. 8 is a schematic of a device including a photonic structure serving as an electromagnetic-radiation beam splitter.

Structures made in accordance with preferred methods can be used in photonic devices as illustrated by FIGS. 7 and 8, for example. FIG. 7 shows the photonic structure 70 being exposed to a broad-band beam 71 of electromagnetic radiation and yielding a narrow-band beam 72. FIG. 8 shows the photonic structure 80 being exposed to a beam of electromagnetic radiation 81 comprising two wavelengths $\lambda_1$ and $\lambda_2$, and yielding narrow-band beams 82 and 83 with respective wavelengths $\lambda_1$ and $\lambda_2$.

While removal of a photonic structure from its growth substrate, e.g. by undercut etching is not precluded, there are many device applications where the structure can remain on the growth substrate. This applies to the structures illustrated by FIGS. 7 and 8, provided the substrate material is transparent to the radiation to be transmitted. Indeed, a photonic structure can be formed on a region of a silicon device wafer, for example, and integrated with other photonic/electronic devices patterned onto the same wafer. For device use on a substrate other than the growth substrate, and even though a grown structure may be too thin to stand alone unsupported, the structure may still be detached from the growth substrate and attached to a different device substrate.

We claim:

1. A method for making a photonic bandgap crystal structure, comprising the steps of:
   (a) supplying, under vapor deposition conditions, a first atmosphere to a surface of a substrate so as to deposit a layer on the substrate, having a first refractive index;
   (b) exposing a pattern portion of the deposited layer to a second atmosphere so as to modify the pattern portion of the deposited layer to have a second refractive index; and
   (c) repeating the steps (a) and (b) until the structure has been grown to a preselected thickness.

2. The method according to claim 1, wherein exposing the pattern portion comprises using a collimator.

3. The method according to claim 1, wherein exposing the pattern portion comprises using a surface-contacting template.

4. The method according to claim 1, wherein exposing the pattern portion comprises beam writing.

5. The method according to claim 1, wherein exposing results in a change of composition.

6. The method according to claim 1, wherein exposing results in a change of microstructure.

7. The method according to claim 1, wherein, in repeated steps, exposing is of a shifted pattern portion.

8. The method according to claim 1, wherein the photonic bandgap crystal structure has refractive index variations in one spatial direction.

9. The method according to claim 1, wherein the photonic bandgap crystal structure has refractive index variations in two spatial directions.

10. The method according to claim 1, wherein the photonic bandgap crystal structure has refractive index variations in three non-coplanar spatial directions.

11. The method according to claim 1, wherein the substrate comprises a material selected from the group consisting of silicon, stainless steel, and a plastic material.

12. The method according to claim 1, wherein the layer comprises a material selected from the group consisting of silicon, silicon-germanium, silicon-carbon, and a carbon-based polymer.

13. The method according to claim 1, wherein the first atmosphere comprises silane.

14. The method according to claim 1, wherein the second atmosphere comprises hydrogen.

15. The photonic bandgap crystal structure made by the method of claim 1.

16. A method for making a photonic bandgap crystal structure, comprising supplying, under vapor deposition conditions, a spatially differentiated atmosphere to a surface of a substrate so as to deposit on the substrate a layer having spatially differentiated refractive index.

17. The method according to claim 16, wherein supplying the spatially differentiated atmosphere comprises using a collimator.

18. The method according to claim 16, wherein the photonic bandgap crystal structure has refractive index variations in one spatial direction.

19. The method according to claim 16, wherein the photonic bandgap crystal structure has refractive index variations in two spatial directions.

20. The method according to claim 16, wherein the photonic bandgap crystal structure has refractive index variations in three non-coplanar spatial directions.

21. The method according to claim 16, wherein the atmosphere comprises silane and hydrogen.

22. The photonic bandgap crystal structure made by the method of claim 16.

23. A photonic device comprising a silicon-based photonic bandgap crystal structure made by the method according to claim 1.

24. The photonic device according to claim 23, wherein the photonic bandgap crystal structure is configured and disposed as a narrow-band-pass electromagnetic-radiation filter.

25. The photonic device according to claim 23, wherein the photonic bandgap crystal structure is configured and disposed as an electromagnetic-radiation beam splitter.

26. A photonic device comprising a silicon-based photonic bandgap crystal structure made by the method according to claim 16.

27. The photonic device according to claim 26, wherein the photonic bandgap crystal structure is configured and disposed as a narrow-band-pass electromagnetic-radiation filter.

28. The photonic device according to claim 26, wherein the photonic bandgap crystal structure is configured and disposed as an electromagnetic-radiation beam splitter.

* * * * *